United States Patent [19]

Wilhelm et al.

[11] Patent Number: 5,397,938
[45] Date of Patent: Mar. 14, 1995

[54] CURRENT MODE LOGIC SWITCHING STAGE

[75] Inventors: Wilhelm Wilhelm, Munich; Jürgen Herrle, Ingolstadt, both of Germany

[73] Assignee: Siemens Aktiengesellschaft, Munich, Germany

[21] Appl. No.: 144,574

[22] Filed: Oct. 28, 1993

[30] Foreign Application Priority Data

Oct. 28, 1992 [DE] Germany .................. 42 36 430.2

[51] Int. Cl.6 ........................................ H03K 19/20
[52] U.S. Cl. ................................. 326/127; 327/482; 327/111
[58] Field of Search ............... 307/454, 455, 443, 494

[56] References Cited

U.S. PATENT DOCUMENTS

| | | | |
|---|---|---|---|
| 4,678,942 | 7/1987 | Kanai | 307/455 |
| 4,906,869 | 3/1990 | Masuoka | 307/455 |
| 4,980,582 | 12/1990 | Waller | 307/455 |
| 5,013,941 | 5/1991 | Jansson | 307/455 |
| 5,177,379 | 1/1993 | Matsumoto | 307/455 |

FOREIGN PATENT DOCUMENTS 036712 5/1990 European Pat. Off. .
0438953 7/1991 European Pat. Off. .
6451945 9/1990 Japan .

OTHER PUBLICATIONS

Proceedings of the IEEE, vol. 78, Nov. 1990, (Wilson) pp. 1707–1719.

*Primary Examiner*—Edward P. Westin
*Assistant Examiner*—Andrew Sanders
*Attorney, Agent, or Firm*—Herbert L. Lerner; Laurence A. Greenberg

[57] ABSTRACT

A current mode logic switching stage, especially an output stage for driving capacitive loads, includes a differential amplifier configuration and at least two bipolar transistors, which are connected as an emitter follower circuit to the output of the differential amplifier configuration. The emitter of one of the bipolar transistors is connected with an output of the switching stage. A controllable current source, which is controlled by a comparison device, is connected between the output and a negative supply potential. The comparison device receives emitter signals of the bipolar transistors. The current source is controlled in such a way that it impresses a high current only during a negative output signal edge. The comparison device is formed with a current mirror.

12 Claims, 2 Drawing Sheets

CURRENT MODE LOGIC SWITCHING STAGE

BACKGROUND OF THE INVENTION

Field of the Invention

The invention relates to a switching stage having a differential amplifier configuration, a first bipolar transistor being connected as an emitter follower circuit to an output of the differential amplifier configuration and having an emitter being connected to an output of the switching stage, a current source connected between the output of the switching stage and a terminal for a supply potential, a second bipolar transistor being connected as an emitter follower circuit to the output of the differential amplifier configuration, the emitter of the first bipolar transistor being connected to a first input of a comparison device and the emitter of the second bipolar transistor being connected to a second input of the comparison device, the current source being a controllable current source with a control input connected to an output of the comparison device, and the controllable current source being controlled by the comparison device in such a way that a high current is impressed by the current source if the potential of the emitter of the first bipolar transistor is higher than the potential of the emitter of the second bipolar transistor, and otherwise a low current being impressed. One such switching stage is known from Published European Application No. 0 367 612 A2 and is shown in FIG. 1 in the form of a basic circuit diagram. In the known switching stage, the comparison device is provided by means of a differential amplifier which is formed with two transistors having emitters that are connected to reference potential through a current source. The controllable current source has a two-stage structure.

Published European Application No. 0 438 953 A1 also discloses a switching stage having a differential amplifier, two bipolar transistors, and a comparison circuit that triggers a current source and is constructed as a current mirror circuit. In that switching stage, however, the two bipolar transistors are triggered by differential amplifier outputs of different polarity.

Patents Abstracts of Japan No. 2-231814 (A), 1990, Vol. 14, No. 541, E-1007, also discloses a switching stage having a differential amplifier, two bipolar transistors, and a comparison circuit that triggers a current source. That comparison circuit is formed by a two-stage current switch. Once again, the bipolar transistors are each triggered by a different output of the differential amplifier.

SUMMARY OF THE INVENTION

It is accordingly an object of the invention to provide a current mode logic switching stage, which overcomes the hereinafore-mentioned disadvantages of the heretofore-known devices of this general type and to disclose further circuit configurations for a comparison device.

With the foregoing and other objects in view there is provided, in accordance with the invention, a switching stage, comprising a switching stage output; a differential amplifier configuration having an output; a first bipolar transistor being connected as an emitter follower circuit to the output of the differential amplifier configuration, the first bipolar transistor having an emitter being connected to the switching stage output; a controllable current source being connected between the switching stage output and a terminal for a supply potential, the controllable current source having a control input; a second bipolar transistor being connected as as an emitter follower circuit, being connected to the output of the differential amplifier configuration, and having an emitter; and a comparison device having a first input connected to the emitter of the first bipolar transistor, a second input connected to the emitter of the second bipolar transistor, and an output connected to the control input of the controllable current source; and the controllable current source being controlled by the comparison device for impressing a high current with the current source if a potential of the emitter of the first bipolar transistor is higher than a potential of the emitter of the second bipolar transistor, and otherwise a low current being impressed.

According to one embodiment of the invention, the comparison device has a current mirror circuit with an input branch and an output branch; the input branch and the output branch each have one first and one second terminal; the first terminal of the input branch is the second input of the comparison device, and the first terminal of the output branch is the first input of the comparison device; the input branch has a series circuit of a first resistor and a diode polarized in the conducting direction, the diode has an anode and a cathode; the output branch has a series circuit of a second resistor and a transistor with a base being connected to the anode of the diode, a collector being connected to the output of the comparison device, and an emitter; and the cathode of the diode and the emitter of the transistor of the output branch form the second terminals of the comparison device and are connected to the terminal for the supply potential.

According to another embodiment of the invention, the comparison device has a third bipolar transistor with a base, an emitter and a collector; resistors are each connected between the terminal for the supply potential and a respective one of the base and the emitter of the third bipolar transistor; the base of the third bipolar transistor is connected to the second input of the comparison device; and another resistor is connected between the collector of the third bipolar transistor and the first input of the comparison device.

An advantage of a switching stage according to the invention is that the current impressed by the controllable current source is high only whenever necessary in order to reverse the charge of the load capacitor. Otherwise, the current is low. The current source may be dimensioned in such a way that the negative switching edge is sufficiently steep to meet speed requirements, while nevertheless the power loss remains low.

Constructing the comparison device as a current mirror circuit has the advantage of ensuring that the output level is largely unaffected by fluctuations in the supply voltage.

In accordance with another feature of the invention, the controllable current source is constructed as a bipolar transistor. Through the use of at least one diode, which is connected between the emitter and the terminal for the supply potential, the base-to-emitter voltage of the bipolar transistor is reduced. This has the advantage of permitting the bipolar transistor to be dimensioned for a lower voltage load. In accordance with a concomitant feature of the invention, there is provided at least one diode between the terminal for the supply potential and the corresponding supply terminals of the comparison device, because as a result, the currents flowing through the comparison device can be lower, or if the currents are the same then the resistors can be dimensioned smaller.

Other features which are considered as characteristic for the invention are set forth in the appended claims.

Although the invention is illustrated and described herein as embodied in a current or common mode logic switching stage, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
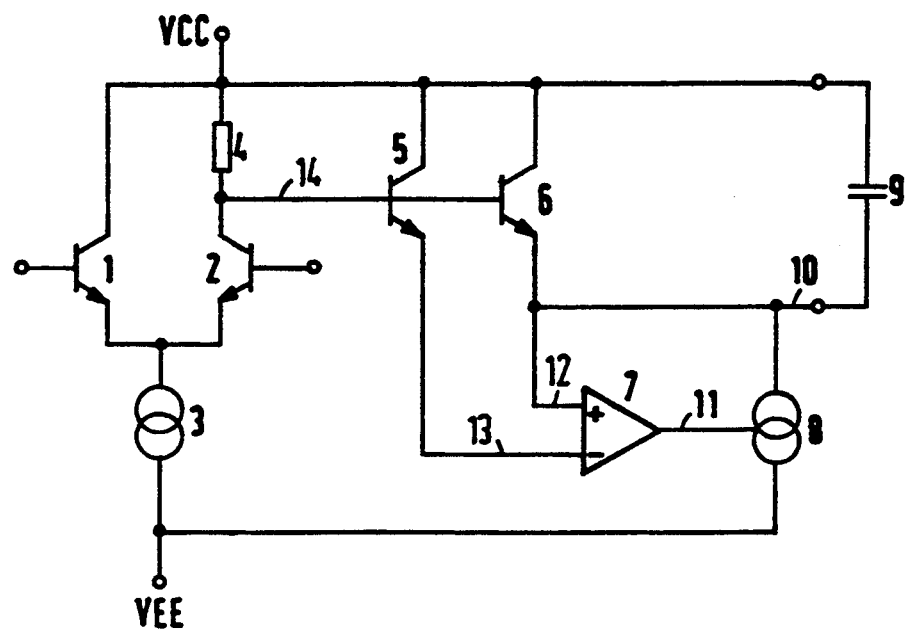
FIG. 1 is a basic schematic circuit diagram of a known switching stage.

Referring now to the figures of the drawing in detail and first, particularly, to FIG. 1 thereof, there is seen a switching stage which includes a differential amplifier configuration that performs a logic function and that is followed by an output stage for driving load capacitors. The differential amplifier configuration includes two emitter-coupled bipolar transistors 1, 2, having emitters which are connected through a current source 3 to a terminal for a negative supply potential VEE. Collectors of the transistors 1, 2 are applied to a terminal for a positive supply potential VCC. A load resistor 4 is connected into a collector circuit of the transistor 2. A base of the transistor 1 is controlled by an input signal, and a base of the transistor 2 is controlled by a reference signal. An output 14 of the differential amplifier configuration is a terminal of the resistor 4 facing toward the collector. The resistor 4 is connected to base terminals of two bipolar transistors 5, 6. With respect to the output of the differential amplifier configuration, the transistors 5, 6 are connected as an emitter follower circuit. An emitter of the bipolar transistor 6 is connected to an output 10 of the switching stage. Further circuits and connecting lines connected to the output 10 function essentially as a capacitive load 9. The output 10 is connected to the potential VEE through a controllable current source 8. The controllable current source 8 has a control input 11, which is connected to an output of a comparison device 7. First and second inputs 12, 13 of the comparison device 7 are respectively connected to the loaded emitter of the transistor 6 and the unloaded emitter of the transistor 5. The comparison device 7 is constructed in such a way that at its output, it generates a signal by means of which a high current can be established in the current source 8 only whenever the emitter of the second transistor 5 is at a lower potential than the emitter of the first transistor 6. In the other operating states, or in other words if the emitter potentials of the transistors 5, 6 are approximately equal, or if the emitter of the transistor 5 has a higher potential than the emitter of the transistor 6, the comparison device 7 generates a signal by which a low current can be established in the current source 8. The mode of operation of the switching stage in a switchover process from an H level to an L level at the output 10 will be described below: The emitter potential of the transistor 5 follows up the collector potential of the transistor 2 largely undelayed, since the emitter of the transistor 5 is not capacitively loaded by the output load. The emitter potential of the transistor 6, because of the capacitor 9, initially follows up the collector potential of the transistor 2 only in delayed fashion. Due to that potential difference at the inputs of the comparison device 7, a signal is generated at its output by which the current source 8 is controlled in such a way that a high current flows. As a result, the capacitor 7 is charged, the emitter potential of the transistor 6 therefore drops and the potential difference at the inputs of the comparison device 7 decreases. The current of the current source 8 is thereupon controlled to be low again. In the opposite switching process, i.e. a transition from an L level to an H level, the potential difference at the inputs of the comparison device 7 is such that the current of the current source 8 is established to be low. The current for discharging the load capacitor 9 in that case flows through the collector-to-emitter path of the transistor 6.

An advantage of the switching stage is that the current of the current source 8 is high only whenever the current required to charge the capacitor 9 is flowing through the current source 8 to the terminal for the supply potential VEE, or in other words at the switch-over from H to L. Therefore, the negative edge can be established as being relatively steep, with an acceptable power loss. With a switching stage of that kind, a high operating speed with a low power loss is made possible.

Figure 2:
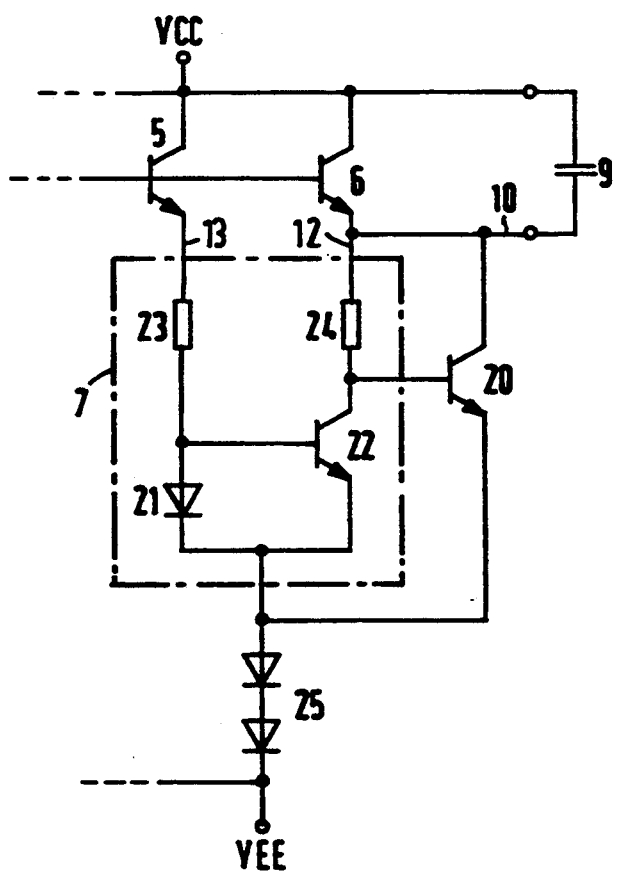
FIG. 2 is a schematic circuit diagram of a first embodiment of an output portion of a switching stage according to the invention.

An embodiment of the comparison device 7 and the current source 8 according to the invention is shown in FIG. 2. The comparison device 7 includes a current mirror circuit with one input branch having elements 21 and 23 to be described below and one output branch having elements 22 and 24 to be described below. The branches are connected by respective first terminals to the emitter of the transistor 5 and the emitter of the transistor 6. The two branches are coupled at second terminals applied to the supply potential VEE. The input branch includes a diode 21, which is connected parallel to a base-to-emitter path of a bipolar transistor 22. A first resistor 23 is disposed between the diode 21 and the emitter of the transistor 5. A second or further resistor 24 is connected between a collector of the transistor 22 and the emitter of the transistor 6. The collector of the transistor 22 serves as the output of the comparison device 7 and it is connected to the control input of the current source 8, which is a bipolar transistor 20. A collector of the bipolar transistor 20 is connected to the output 10 of the switching stage and an emitter of the transistor 20 is connected to the supply potential VEE.

The coupled second terminals of the input and output branches of the current mirror circuit are coupled to the emitter of the current source transistor 20 and they are connected to the terminal for the supply potential VEE through two diodes 25. The effect of the diodes 25 is to permit the transistor 20 and the elements of the comparison device 7 to be constructed for a lower operating voltage.

In the process of a switchover from H to L that is of interest for the mode of operation of the comparison device 7, the emitter potential of the unloaded transistor 5 drops relatively fast. The voltage drop at the resistor 23 is reduced, so that the current in the input branch 21, 23 of the current mirror circuit decreases. The lower current, which is reflected into the output branch 22, 24, produces a lesser current drop at the resistor 24. Moreover, the emitter potential of the loaded emitter of the transistor 6 is still largely at H. The result of this is that the base potential of the transistor 20 is high, and the transistor 20 conducts. The capacitor 9 is then charged through the transistor 20. The emitter potential of the transistor 6 drops to L, and as a result the transistor 20 comes to be of high impedance, given a suitable dimensioning of the components. If there are fluctuations in the supply potential VEE, the ratio between the currents of the input branch and the output branch of the current mirror circuit remains the same. Fluctuations in the supply voltage are not transmitted to the output 10.

Figure 3:
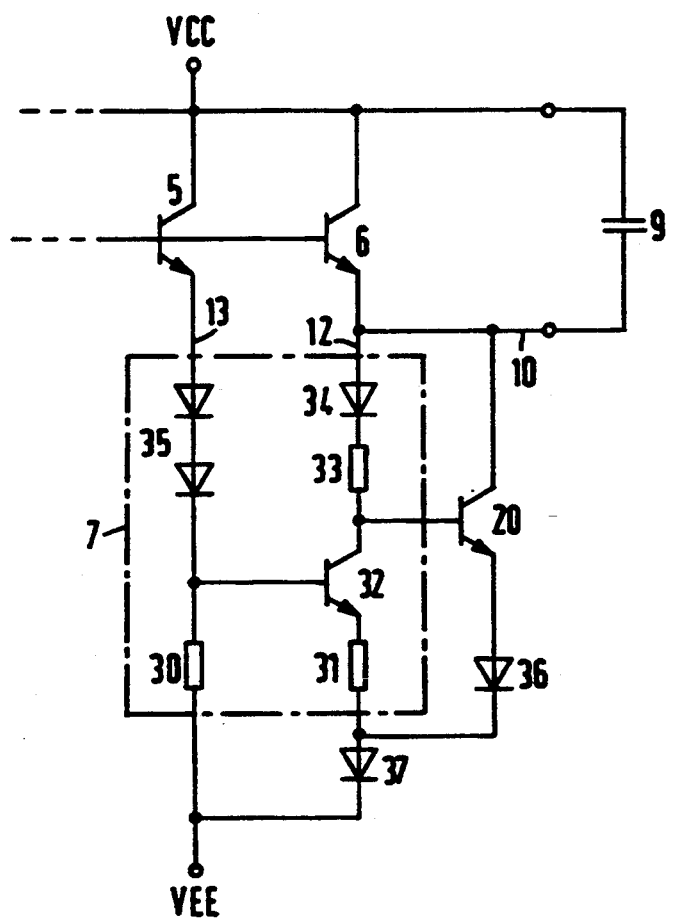
FIG. 3 is a schematic circuit diagram of a second embodiment of the output portion of a switching stage according to the invention.

FIG. 3 shows a further embodiment according to the invention for the comparison circuit 7. The controlled current source is constructed as a bipolar transistor 20, having an emitter which is connected through two diodes 36, 37 to the terminal for the supply potential VEE. The comparison device 7 has a first current path, which includes a resistor 30 that has one terminal connected to the supply potential VEE and another terminal connected through two diodes 35 to the emitter of the transistor 5. A second current path includes a collector-to-emitter path of a third bipolar transistor 32 having a base which is connected to the other terminal of the resistor 30. The emitter of the bipolar transistor 32 is applied through a resistor 31 to the supply potential VEE. As shown in FIG. 3, the resistor 31 may be connected to the terminal for the supply potential VEE through the diode 37. The collector of the bipolar transistor 30 serves as the output of the comparison device 7 and it is connected to the emitter of the transistor 6 through a resistor 33 and a diode 34.

In the process of a switchover from H to L which is of interest herein, the voltage at the resistor 30 is lowered, and as a result the resistance of the collector-to-emitter path of the transistor 32 increases and the current decreases. As a result, the voltage drop at the resistor 33 becomes less, and therefore the collector potential of the transistor 32 rises. The current source transistor 20 is then strongly conducting. As a result, the capacitor 9 is charged. As the potential at the output 10 drops, the current source transistor 20 comes to have high impedance.

The diodes 34, . . . , 37 serve to shift potential, so that the components can be dimensioned for lower operating voltages. It is possible in principle to eliminate the diode 34 and one of the diodes 35. Otherwise, other diodes may be inserted between the resistors 30, 31 and the terminal for the supply potential VEE.

We claim:

1. A switching stage, comprising:
a switching stage output;
a differential amplifier configuration having an output;
a first bipolar transistor being connected as an emitter follower circuit to said output of said differential amplifier configuration, said first bipolar transistor having an emitter being connected to said switching stage output;
a controllable current source being connected between said switching stage output and a terminal for a supply potential, said controllable current source having a control input;
a second bipolar transistor being connected as as an emitter follower circuit, being connected to said output of said differential amplifier configuration, and having an emitter; and
a comparison device having a first input connected to the emitter of said first bipolar transistor, a second input connected to the emitter of said second bipolar transistor, and an output connected to said control input of said controllable current source;
said controllable current source being controlled by said comparison device for impressing a high current with said current source if a potential of the emitter of said first bipolar transistor is higher than a potential of the emitter of said second bipolar transistor, and otherwise a low current being impressed;
said comparison device having a current mirror circuit with an input branch and an output branch;
said input branch and said output branch each having one first and one second terminal;
said first terminal of said input branch being said second input of said comparison device, and said first terminal of said output branch being said first input of said comparison device;
said input branch having a series circuit of a first resistor and a diode polarized in the conducting direction, said diode having an anode and a cathode;
said output branch having a series circuit of a second resistor and a transistor with a base being connected to the anode of said diode, a collector being connected to said output of said comparison device, and an emitter; and
the cathode of said diode and the emitter of said transistor of said output branch forming said second terminals of said comparison device and being connected to said terminal for the supply potential.

2. The switching stage according to claim 1, including at least one other diode being connected between said second terminals of said input and output branches of said current mirror circuit and said terminal for the supply potential.

3. A switching stage, comprising:
a switching stage output;
a differential amplifier configuration having an output;
a first bipolar transistor being connected as an emitter follower circuit to said output of said differential amplifier configuration, said first bipolar transistor having an emitter being connected to said switching stage output;
a controllable current source being connected between said switching stage output and a terminal for a supply potential, said controllable current source having a control input;
a second bipolar transistor being connected as as an emitter follower circuit, being connected to said output of said differential amplifier configuration, and having an emitter; and
a comparison device having a first input connected to the emitter of said first bipolar transistor, a second input connected to the emitter of said second bipolar transistor, and an output connected to said control input of said controllable current source;
said controllable current source being controlled by said comparison device for impressing a high current with said current source if a potential of the emitter of said first bipolar transistor is higher than a potential of the emitter of said second bipolar transistor, and otherwise a low current being impressed;

said comparison device having a third bipolar transistor with a base, an emitter and a collector;

resistors each being connected between said terminal for the supply potential and a respective one of the base and the emitter of said third bipolar transistor;

the base of said third bipolar transistor being connected to said second input of said comparison device; and another resistor connected between the collector of said third bipolar transistor and said first input of said comparison device.

4. The switching stage according to claim 3, including at least one diode connected between the base of said third bipolar transistor of said comparison device and said second input of said comparison device.

5. The switching stage according to claim 3, including:

two diodes connected between the base of said third bipolar transistor of said comparison device and said second input of said comparison device; and another diode connected between said other resistor and said first input of said comparison device.

6. The switching stage according to claim 3, including a further diode connected between said resistor connected to the emitter of said third bipolar transistor of said comparison device and said terminal for the supply potential.

7. The switching stage according to claim 4, including a further diode connected between said resistor connected to the emitter of said third bipolar transistor of said comparison device and said terminal for the supply potential.

8. The switching stage according to claim 5, including a further diode connected between said resistor connected to the emitter of said third bipolar transistor of said comparison device and said terminal for the supply potential.

9. The switching stage according to claim 1, wherein said controllable current source includes a bipolar transistor having a collector being connected to said switching stage output, an emitter being connected to said terminal for the supply potential, and a base being said control input of said controllable current source.

10. The switching stage according to claim 3, wherein said controllable current source includes a bipolar transistor having a collector being connected to said switching stage output, an emitter being connected to said terminal for the supply potential, and a base being said control input of said controllable current source.

11. The switching stage according to claim 9, including at least one diode connected between the emitter of said bipolar transistor of said controlled current source and said terminal for the supply potential.

12. The switching stage according to claim 10, including at least one diode connected between the emitter of said bipolar transistor of said controlled current source and said terminal for the supply potential.

* * * * *